United States Patent
Bouche et al.

(10) Patent No.: US 7,504,007 B2
(45) Date of Patent: Mar. 17, 2009

(54) PROCESS FOR OBTAINING A THIN, INSULATING, SOFT MAGNETIC FILM OF HIGH MAGNETIZATION

(75) Inventors: Guillaume Bouche, Grenoble (FR); Pascal Ancey, Revel (FR); Bernard Viala, Sassenage (FR); Sandrine Couderc, Grenoble (FR)

(73) Assignees: STMicroelectronics S.A., Montrouge (FR); Commissariat a L'Energie Atomique, Paris (FR)

( * ) Notice: Subject to any disclaimer, the term of this patent is extended or adjusted under 35 U.S.C. 154(b) by 519 days.

(21) Appl. No.: 11/189,028

(22) Filed: Jul. 25, 2005

(65) Prior Publication Data
US 2006/0082390 A1   Apr. 20, 2006

(30) Foreign Application Priority Data
Jul. 27, 2004   (FR) .................................. 04 08289

(51) Int. Cl.
*C23C 14/35* (2006.01)
*C23C 16/00* (2006.01)

(52) U.S. Cl. .................... 204/192.2; 427/127; 427/128; 427/130; 427/131

(58) Field of Classification Search .............. 204/192.2; 427/127, 128, 130, 131
See application file for complete search history.

(56) References Cited

U.S. PATENT DOCUMENTS

| | | | | |
|---|---|---|---|---|
| 4,969,962 A | * | 11/1990 | Watanabe et al. | 148/306 |
| 5,755,986 A | * | 5/1998 | Yamamoto et al. | 252/62.54 |
| 6,136,431 A | * | 10/2000 | Inoue et al. | 428/812 |
| 6,171,716 B1 | * | 1/2001 | Sasaki et al. | 428/811.4 |
| 2003/0184921 A1 | * | 10/2003 | Sugita et al. | 360/324.1 |

FOREIGN PATENT DOCUMENTS

EP   1 020 878   7/2000

OTHER PUBLICATIONS

Roozeboom, et al., "Soft-Magnetic Fluxguide Materials," Philips Journal of Research, Elsevier, Amsterdam, NL, vol. 51, No. 1, 19998 pp. 59-9', XP004124674, ISSN: 0165-5817.
Preliminary French Search Report, FR 04 08289, dated Mar. 21, 2005.

* cited by examiner

*Primary Examiner*—Rodney G McDonald
(74) *Attorney, Agent, or Firm*—Gardere Wynne Sewell LLP

(57) ABSTRACT

A thin soft magnetic film combines a high magnetization with an insulating character. The film is formed by nitriding Fe-rich ferromagnetic nanograins immersed in an amorphous substrate. A selective oxidation of the amorphous substrate is then performed. The result is a thin, insulating, soft magnetic film of high magnetization. Many types of integrated circuits can be made which include a component using a membrane incorporating the above-mentioned thin film.

30 Claims, 2 Drawing Sheets

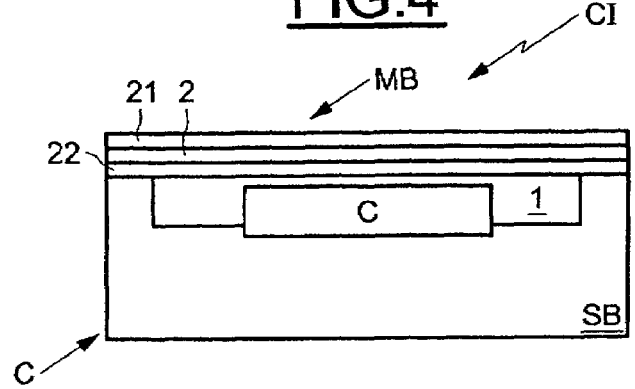
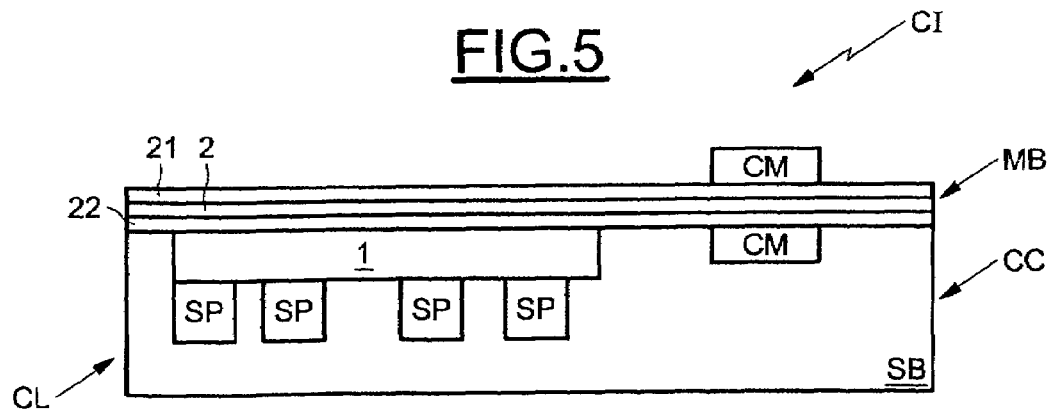

PROCESS FOR OBTAINING A THIN, INSULATING, SOFT MAGNETIC FILM OF HIGH MAGNETIZATION

PRIORITY CLAIM

The present application claims priority from French Application for Patent No. 04 08289 filed Jul. 27, 2004, the disclosure of which is hereby incorporated by reference.

BACKGROUND OF THE INVENTION

1. Technical Field of the Invention

The present invention relates to ways of obtaining granular, insulating, soft magnetic films of high magnetization and to their possible applications in the microelectronics field and more particularly in radiofrequency (RF) applications.

2. Description of Related Art

Within the context of the invention, the term "granular film" is understood to mean a film formed from two phases, the first being generally dispersed in the second. The first phase here is crystalline and the second is amorphous.

The term "soft magnetic film" is understood to mean a film having a magnetization that is easily reversible, characterized among other things by a low coercive field ($Hc \leq 5$ Oe).

The term "high magnetization" is understood to mean a film possessing a high saturation magnetization ($Ms > 1$ T). The term "insulating film" is understood to mean a film having a very low conductivity, i.e., a resistivity $\rho \geq 500\ \mu\Omega\cdot cm$, and for example a resistivity of $\rho \geq 10^3\ \mu\Omega\cdot cm$.

The term "magnetic film for RF applications" is understood to mean a film that satisfies the conventional theory of coherent magnetization rotation described by the celebrated Landau-Lifshitz-Gilbert model on the basis of the existence of an induced uniaxial magnetic anisotropy characterized by an anisotropy field ($Hk > Hc$).

U.S. Pat. No. 5,573,863 discloses films of soft magnetic alloys comprising a nanocrystalline phase, essentially consisting of cubic Fe, and an amorphous phase comprising a rare earth element or Ti, Zr, Hf, V, Nb, Ta or W and oxygen in a substantial quantity, the two phases being in the form of a mixture. The choice of iron is justified for its high magnetization.

The solution described relies on the known amorphizing character of FeX alloys with $X \geq 15\%$ by weight, where X represents Ti, Zr, Hf, V, Nb, Ta or W, these elements being deposited by sputtering. The suitable magnetic properties are conventionally obtained after partial crystallization of the compound by a magnetothermal treatment at 400° C. after deposition.

This makes it possible to obtain a relatively dense nanocrystalline ferromagnetic phase dispersed in the initial amorphous matrix. By obtaining a microstructure consisting of ferromagnetic grains strongly coupled together on the nanoscale, it is easier to achieve the conditions for obtaining the soft magnetic character of the film.

A first difficulty consists of the fact that the volume fraction of the nanocrystalline (ferromagnetic) phase is generally low (less than 80%), which does not allow a high magnetization to be achieved. Here, the proposed method adds to the known process the reactive aspect, using oxygen. Of course, this leads to oxidation of the film and to an increase in its resistivity. However, the oxidation process is not selective—it relates both to the grains and to the matrix.

The second difficulty consists of the fact that there is an even greater reduction in the magnetization because of the oxidation of the ferromagnetic crystalline phase of Fe. From this it follows that an insulating character cannot be reconciled with high magnetization.

U.S. Pat. No. 5,725,685 discloses soft magnetic alloy films similar to those described in U.S. Pat. No. 5,573,863, with the sole difference that the amorphous phase contains nitrogen in a substantial quantity and not oxygen. This process makes it possible to avoid the problem of oxidation of the ferromagnetic phase and of maintaining a higher magnetization. However, the resistivity levels are markedly too low owing to the absence of oxidation. It also follows from this that it is impossible to reconcile an insulating (or highly resistive) character here with high magnetization.

European Patent Application No. EP 1,361,586 describes a method of producing a thin magnetic film possessing a high magnetization and an insulating character. This film is prepared using the technique of non-reactive cosputtering using two targets composed respectively of a magnetic alloy and of a dielectric. The advantage of this method is that it relies on a non-reactive process (bombardment by only neutral ionic species), preventing the ferromagnetic grains from being oxidized and making it possible in theory to maintain a high magnetization. The method described may either be sequential (alternating deposition of multilayers) or concomitant (simultaneous code position).

The film described is formed from nanometric CoFe ferromagnetic grains (CoFe being chosen for its high magnetization) that are encapsulated in a dielectric matrix, composed, for example, of $Al_2O_3$ or $SiO_2$. The difficulty in this case stems from the choice of the CoFe alloy, which is not naturally soft. Thus, the soft magnetic properties of the film can be provided only on condition that the size of the CoFe grains (typically less than 10 nm) are sufficiently reduced and that strong intergranular coupling be maintained, which assumes a relatively small inter-grain distance (typically less than 5 nm).

However, the insulating character requires a certain volume of dielectric material encapsulating the ferromagnetic grains so as to avoid too high a percolation factor. The adjustments in terms of processes (respective volume fractions of the two phases) are, in this sense, contradictory. The use of CoFe alloys, initially justified by a very high intrinsic magnetization, therefore makes this method difficult and limiting. It is therefore impossible to reconcile insulating character with high magnetization.

The trend in the microelectronics field is more and more for ever decreasing individual dimensions of the components in integrated circuits. For certain components this poses a problem.

At the present time, the use of inductors, essentially of planar geometry, within these RF circuits places a limit in terms of the ratio of inductance to area occupied.

Introducing ferromagnetic layers with a high permeability ($\mu'$) allows this ratio to be increased significantly. These layers must meet the constraints of being used at high frequency, especially in dissipative terms, so as to comply with a high quality factor of the component.

Their integration must therefore minimize the additional losses, the origin of which are mainly magnetic ($\mu''$) and capacitive (C). The capacitive losses stem from the juxtaposition of several metal levels separated by dielectrics needed for the fabrication of the component.

The first contribution may be minimized by establishing a high ferromagnetic resonance frequency (FRF) thanks especially to the use of layers with a high saturation magnetization. In certain cases, the aim will on the contrary be to use the adsorbtivity at ferromagnetic resonance (maximum $\mu''$) for electromagnetic screening functionalities. The capacitive contribution remains the more limiting and the more difficult to get round in the current prior art, in which the thin ferromagnetic layers suitable from the magnetic standpoint are conducting in character.

At the present time, known soft magnetic materials with a high magnetization form the FeXN family with X: Al, Si, Ta, Zr, Hf, Rh, or Ti. Unlike U.S. Pat. No. 5,725,685 these materials are obtained directly in the nanocrystallized state with an amorphous matrix by reactive sputtering in a stream of nitrogen.

The incorporation of nitrogen atoms during the growth of the film allows the grain size to be progressively reduced (down to 5 nm) and allows the associated volume fraction to be controlled, which remains high ($\geq 90\%$). These materials have in general a high magnetization (from 1.8 to 2 T) and excellent soft magnetic properties up to several GHz.

On the other hand, they do not make it possible to achieve optimum results in terms of integration in RF inductive coils (self-inductors). This is because the resistivity ($\rho$) of these materials remains too low, of the order of 150 $\mu\Omega$·cm. Despite the dispersion of the conducting FeXN crystalline phase in a resistive amorphous matrix, the overall character of the material remains essentially conducting.

The use of such a conducting material for this type of application is the basis of problems relating to the capacitive coupling between the plane and the inductive coil, which very greatly degrades the load and does not make it possible to obtain quite high quality factor values (typically $Q \geq 30$). The FeXO-type materials of insulating character described in the literature themselves do not have suitable magnetic properties (magnetization too low).

The current research remains focused on insulating magnetic materials of high permeability allowing contact between a magnetic plane and an inductive coil, or even the encapsulation of the inductive coil, so as to improve the compactness and the performance of these components in general.

There is a need in the art for a material having the advantage of being both insulating and optimum from the standpoint of the intended magnetic properties. The term "optimum magnetic properties" is understood to mean the combination of a high magnetization ($\geq 1.5$ T), a low coercive field (Hc$\leq 5$ Oe) and a uniaxial anisotropy field (H$_k \geq 10$ Oe). Its insulating property prevents any problem of capacitive coupling between the magnetic plane and the inductive coil, thus making it possible to obtain a maximum gain ($\geq 100\%$) in the value of the inductive coil and to improve its quality factor. As the insulating film has a very low conductivity, it does not generate supplementary capacitive effect once integrated in an RF device.

SUMMARY OF THE INVENTION

Embodiments of the present invention relate processes for obtaining a thin, insulating, soft magnetic film of high magnetization, comprising the nitriding of Fe-rich ferromagnetic nanograins immersed in an amorphous substrate, and the selective oxidation of the amorphous substrate.

Thus, an embodiment of the invention provides, in combination, the nitriding of the nanograins and the selective oxidation of the amorphous substrate constituting the intercrystalline matrix. This makes it possible to obtain a material of the FeXNO type, which therefore contains both oxygen and nitrogen, avoiding the problem of the oxidation of the Fe-rich ferromagnetic phase responsible for the reduction in the saturation magnetization.

According to one embodiment of the invention, the ferromagnetic nanograins are formed mainly from FeXN with X being preferably chosen from the following elements: Zr, Nb, Mo, Ru, Rh, Pd, Hf, Ta, W, Ir and Pt. The list may be extended to elements from the family of rare earths (lanthanides) and to the following elements: Al, Si, Ti, V, Cr, Mn and Cu.

The nitriding may be carried out by reactive sputtering using an FeX target in the presence of nitrogen with a uniaxial magnetic field being applied in the plane of the substrate.

The oxidation may be carried out by reactive sputtering in the presence of oxygen. This process may be performed at the same time as the nitriding process, in a continuous or sequential manner.

The oxidation may be carried out by cosputtering from an XO target, with X defined as above. This process may be carried out concomitantly with the nitriding process, resulting in the production of a heterogeneous film consisting of aggregates of FeXN and XO materials. This process may also be carried out sequentially with the nitriding process, resulting in the production of a heterogeneous film consisting of an alternation of FeXN and XO multi layers.

The latter embodiment relies on the selective diffusion of oxygen from the XO aggregates or layers into the amorphous matrix of the FeXN aggregates or layers by post-deposition heat treatment.

Embodiments of the invention also relate to a thin, insulating, soft magnetic film of high magnetization, comprising an oxidized amorphous substrate in which nitrided Fe-rich ferromagnetic nanograins are immersed.

The nanograins may for example consists of an FeXN crystalline phase and the amorphous substrate may consist of X or XN, X being as defined above. The nanograins preferably have a diameter of less than 10 nm and a body-centered cubic (bcc) or body-centered tetragonal (bct) structure.

According to one embodiment, the amorphous phase represents less than 20% of the total volume of the thin film.

Each element is present within the film, for example, in the following proportions in at %: Fe$_a$X$_b$N$_c$O$_d$, in which a+b+c+d=100% and:

$45\% \leq a \leq 90\%$, $1\% \leq b \leq 5\%$ $5\% \leq c \leq 20\%$ $5\% \leq d \leq 30\%$.

Embodiments of the present invention also propose an integrated circuit comprising at least one component using a membrane incorporating a thin film as defined above.

The component is, for example, inductive and the membrane of the inductive component may be fixed or able to move.

When the membrane is fixed, the distance separating the membrane from the inductive component may be reduced to a minimum. The magnetic film preferably has a high magnetic permeability $\mu'$ and low magnetic losses $\mu''$, thereby making it possible to maximize the value of the inductance and increasing the quality factor. It is also possible, for example, to obtain smaller coils of equal performance.

When the membrane of the inductive component is fixed, it can form a screening cover for the inductive component. The magnetic film of the membrane has, in this case, preferably a low magnetic permeability $\mu'$ and high magnetic losses $\mu''$ so as to form a true electromagnetic screen with no effect on the inductance of the component.

When the membrane is able to move, the magnetic film preferably has a high magnetic permeability µ' and low magnetic losses µ". This allows the inductance of the component to be controlled according to the position of the membrane relative to the turns.

Other examples of integrated circuits according to the invention include, for example, circuits in which the membrane forms a cover for encapsulating the component, or a support for another component. The component may also be a capacitive component, the membrane then forming the dielectric of the capacitive component.

The integrated circuits may also comprise two or more than two different components using two different parts of the same membrane.

Thus, the invention is particularly advantageous in this regard as it allows co-integration of the several components on the integrated circuit using same wafer-scale membrane.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 1 to 5 show schematically various integrated circuits comprising components using a thin film according to embodiments of the invention.

DETAILED DESCRIPTION OF THE PREFERRED EMBODIMENTS

Figure 1:
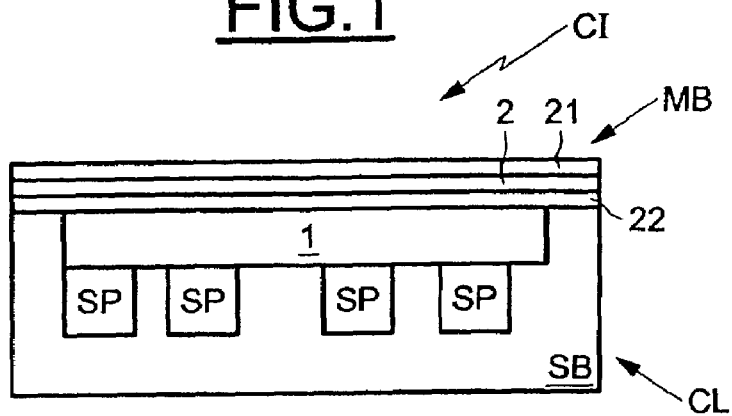

Embodiments of the invention make it possible to obtain a thin, insulating, soft ferromagnetic film of high magnetization from Fe-rich ferromagnetic nanograins immersed in an amorphous substrate and comprises a step of in situ nitriding of the nanograins and a step of in situ selective oxidation of the amorphous matrix.

Within the context of the invention, the term "Fe-rich nanograins" is understood to mean nanograins having an iron content greater than 85% by weight.

The process for obtaining such a thin film may be carried out for example according to two variants: the first consists of reactive cathode sputtering of FeX layers in a stream of nitrogen and oxygen; the second consists of selective oxygen diffusion in a heterogeneous compound formed from collection of FeXN/XO aggregates or bilayers.

The first variant consists of cathode sputtering of FeX layers in a stream of nitrogen and oxygen.

These films are produced by known techniques, for example by ion bombardment (RF/DC, diode, magnetron or ion beam) in a main stream of argon and secondary streams of nitrogen and oxygen, at room temperature.

The growth of the layers takes place in a uniaxial magnetic field of about 100-200 Oe applied in the plane of the substrate. The optimum deposition conditions are achieved for a pressure of $3 \times 10^{-3} - 5 \times 10^{-3}$ mbar, a mean gas flow rate of 50-100 sccm and at room temperature.

The nitriding and oxidation processes are controlled respectively by means of the degrees of enrichment with the secondary (reactive) gases injected into the chamber. The relative degree of enrichment with nitrogen is defined by the ratio $N_2/(Ar+N_2+O_2)$ and the degree of enrichment with oxygen is defined by the ratio $O_2/(Ar+N_2+O_2)$. These ratios may typically vary within a range from 0.1% to 10%. The thicknesses of the films formed are between 500 Å to 5000 Å.

The microstructure of the material obtained is as defined below. For a nitrogen content of less than 5 at %, the microstructure consists of a single bcc or bct (body-centered cubic or body-centered tetragonal) crystalline phase consisting of FeXN grains.

The mean diameter of the grains is of the order of 100 to 10 nm, which does not satisfy the conditions for obtaining soft magnetic properties (Hc>10 Oe). These films do not possess induced magnetic anisotropy. They have naturally high saturation magnetization ($M_s \geq 1.9$ T).

For a nitrogen content of between 5 at % and 20 at %, the thin films are then composed of a fine nanostructure comprising bcc or bct FeXN nanograins randomly distributed in an X-rich amorphous matrix.

The nitrogen is incorporated in the interstitial position in the crystallographic lattice of the FeX nanograins until saturation of the solid solution in the grains (at about 15-20 at %). This incorporation is accompanied by a substantial expansion of the FeX crystalline lattice (by up to 5%), the consequence of which is a reduction in the mean grain size.

Under these conditions, the FeXN grains have a mean diameter of around 10 to 2 nm with a mean intergranular distance of around 5 to 1 nm. This makes it possible to obtain soft magnetic properties as defined above ($H_c \leq 5$ Oe). These films possess an induced magnetic anisotropy characterized by an anisotropy field of around 10 to 40 Oe. These films maintain a high saturation magnetization, typically around 1.9 to 1.5 T. The electrical resistivity of the films increases with the increase in nitrogen content, typically up to 200 µΩ·cm.

Above 20 at %, the excess nitrogen becomes fixed in the amorphous matrix. The latter then becomes the predominant phase in terms of volume proportion and the films tend towards a completely amorphous microstructure no longer exhibiting soft magnetic properties (Hc>20 Oe).

With the nitriding process having led to the microstructure described above, the in situ oxidation process results in preferential incorporation of the oxygen into the X-rich amorphous matrix.

For various oxygen concentrations and for a nitrogen concentration of between 5 and 20 at %, the films have the corresponding microstructure described above with grains having a diameter of around 10 to 2 nm that are approximately 5 to 1 nm apart and encapsulated by a very highly resistive amorphous matrix rich in phases of the XO or XNO type. This allows the soft magnetic properties as defined above (Hc≦5 Oe) to be maintained with a substantial increase in the electrical resistivity of the films until macroscopic insulating character is obtained.

A second variant consists of the selective diffusion of oxygen through heterogeneous structures of the FeXN+XO type.

This selective diffusion may be carried out through the FeXN and XO multilayers produced by cathode sputtering from an FeX target and from an XO target. These films may be obtained by the same techniques and conditions as those mentioned above within the context of the reactive cathode sputtering (the first variant).

The nitriding process is controlled by the degree of enrichment with nitrogen injected into the chamber, defined by the ratio $N_2/(Ar+N_2)$, which may typically vary within a range from 0.1% to 10%. The thicknesses of the FeXN films formed here are between 20 Å and 500 Å. The films correspond to those having a nitrogen content of between 5 and 20 at % as described above.

The thin XO films are themselves produced by known techniques, for example by ion bombardment (RF, diode or magnetron or by ion beam). The thickness of the XO film formed varies from 20 Å to 500 Å. The number of FeXN/XO bilayers may vary from 2 to 100.

The post-deposition annealing operations (with or without a magnetic field) are carried out in a high-vacuum oven. The annealing temperatures are between 150° C. and 400° C. and the annealing time is between 1 h and 8 h. The annealing allows selective diffusion of oxygen mainly into the X-rich amorphous matrix constituting the FeXN layers. Thus, the degree of oxidation of the amorphous matrix and the resistivity of the films vary depending on the experimental conditions of the annealing. The microstructure of the said films is identical to that obtained in the first variant, i.e. cathode sputtering of the FeX layers in a stream of nitrogen and of oxygen, described above.

The selective oxygen diffusion may also be carried out through the heterogeneous layers consisting of FeXN and XO aggregates, produced by cathode cosputtering from a target comprising the two constituents FeX and XO. These films may be obtained by the same techniques and conditions as those mentioned above within the context of the reactive cathode sputtering (the first variant).

The nitriding process is controlled by the degree of enrichment with nitrogen injected into the chamber, defined by the ratio $N_2/(Ar+N_2)$, which may typically vary within a range from 0.1% to 10%. The thicknesses of the FeXN films formed here are between 500 Å and 5000 Å. The films correspond to those having a nitrogen content of between 5 and 20 at % as described above.

The post-deposition annealing operations and the final characteristics of the films are identical to those described in the first subvariant.

In general, the thin, insulating, soft magnetic film of high magnetization according to the invention comprises a crystalline phase and an amorphous phase. The crystalline phase is dispersed in the amorphous phase.

Depending on the embodiment, the crystalline phase consists of nanograins of Fe rich FeXN with interstitial solid solution of nitrogen up to the limit of solubility. X is preferably chosen from the following elements: Zr, Nb, Mo, Ru, Rh, Pd, Hf, Ta, W, Ir, Pt. The list may be extended to elements of the rare earth family (lanthanides) and to the following elements: Al, Si, Ti, V, Cr, Mn and Cu. The grains have a diameter of less than 10 nm, possess a bcc or bct structure and are not oxidized.

Depending on the embodiment (and its variants), the amorphous phase is formed mainly from X, N and O rich in X containing nitrogen and mainly oxygen, X being defined above. This phase constitutes an insulating matrix encapsulating the said grains with an intergranular distance of less than 5 nm. Advantageously, this phase represents less than 20% of the total volume of the film.

Considering an $Fe_aX_bN_cO_d$ film by way of indication and for X taken from the abovementioned first series, the respective contents for each element in atomic percentages are within the following ranges: $45\% \leq a \leq 90\%$; $1\% \leq b \leq 5\%$; $5\% \leq c \leq 20\%$; $5\% \leq d \leq 30\%$ with $a+b+c+d=100\%$.

By way of indication and for X taken from the first abovementioned series, the table below gives a few useful magnetic and electrical characteristics depending on the proportion of these elements in the films obtained according to the invention (a, b, c and d are given in atomic percentages).

| Composition | a | b | c | d | Ms (T) | ρ (μΩ·cm) |
|---|---|---|---|---|---|---|
| $Fe_aX_bN_cO_d$ | 45 | 5 | 20 | 30 | 0.8 | $10^3$-$10^6$ |
|  | 46 | 4 | 20 | 30 | 0.9 |  |
|  | 47 | 3 | 20 | 30 | 1.0 |  |
|  | 48 | 2 | 20 | 30 | 1.1 |  |
|  | 49 | 1 | 20 | 30 | 1.2 |  |
|  | 52 | 3 | 15 | 30 | 1.3 |  |
|  | 57 | 3 | 10 | 30 | 1.35 |  |
|  | 62 | 3 | 5 | 30 | 1.4 |  |
|  | 67 | 3 | 5 | 25 | 1.5 | $10^3$-$10^4$ |
|  | 72 | 3 | 5 | 20 | 1.55 |  |
|  | 82 | 3 | 5 | 10 | 1.65 |  |
|  | 85 | 5 | 5 | 5 | 1.7 | 500-$10^3$ |
|  | 86 | 4 | 5 | 5 | 1.75 |  |
|  | 87 | 3 | 5 | 5 | 1.8 |  |
|  | 88 | 2 | 5 | 5 | 1.85 |  |
|  | 89 | 1 | 5 | 5 | 1.9 |  |

One advantageous characteristic of these films consists of their resistivities, which may, depending on the case of the order to $10^3$ to $10^6$ μΩ·cm. In addition, the selective oxidation of the intergranular X-rich matrix, and not of the ferromagnetic Fe-rich grains, allows a high magnetization to be maintained.

Finally, the selective nitriding of the Fe-rich crystalline phase allows suitable soft an anisotropic magnetic properties to be obtained. It is therefore possible to obtain a soft magnetic film which is both insulating and has a high magnetization satisfying the operating conditions for applications in the radiofrequency regime. The thin films obtained according to the invention typically have a thickness varying from $5 \times 10^{-2}$ to 1 μm.

Integrated circuits may be produced using the thin, insulating, soft films according to the invention. The films are incorporated into a membrane, the said membrane being used in the preparation of a component intended for the production of an integrated circuit.

FIG. 1 shows schematically an example of an integrated circuit IC according to the present invention, which comprises as component C an inductive component $C_L$. The inductive component $C_L$ comprises metal turns MT that are placed in a substrate SB below a cavity 1 hollowed out in the substrate. The inductive component $C_L$ also includes a magnetic membrane MB consisting of a thin soft magnetic film 2 which, in this particular embodiment, is sandwiched between two passivation layers 21 and 22. The passivation layers provide here both protection of the film 2 and better mechanical integrity of the membrane.

The passivation layers 21 and 22 are produced by means of known methods with materials that are also known, such as those based on silicon oxide and silicon nitride. The membrane preferably comprises a magnetic film of the FeHfNO type.

Figure 2:
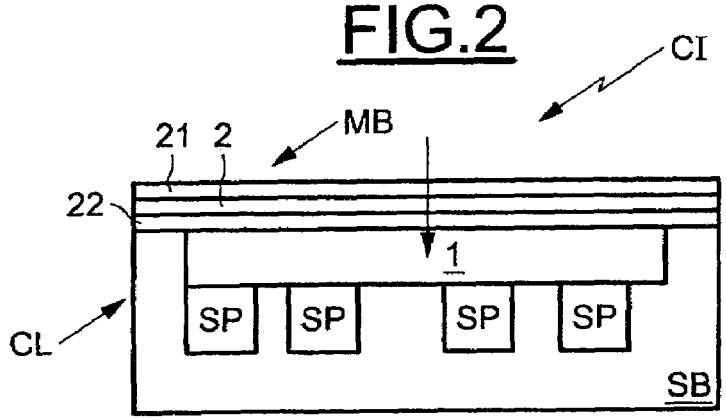

The membrane MB may be fixed (FIG. 1) or it can move (FIG. 2) in the direction of the turns by any known means (thermal expansion, mechanical means, piezoelectric means, etc.). When the membrane is movable, the value of the inductance L of the inductive component $C_L$ can be modified in a controlled manner.

When the membrane MB is fixed, the distance separating the membrane from the RF inductive component may be reduced to a minimum. The magnetic film 2 of the membrane preferably has a high magnetic permeability μ' (typically $\geq 100$) and has low magnetic losses μ" (typically $\leq 10$). This allows the inductance to be increased (typically by 30% to 120%) and allows a high quality factor (typically $Q \geq 10$). It is also possible, for example, to obtain smaller coils with equal performance.

When the membrane MB of the inductive component is fixed, it may form a screening cover for the inductive component. In this case, the magnetic film 2 of the membrane preferably has a low magnetic permeability μ' (typically ≦100) and a high magnetic loss μ" (typically ≧500). In this case, the fixed membrane of the active component forms a screening cover for the inductive component.

However, when the membrane MB can be moved, the magnetic film 2 of the membrane has a high magnetic permeability μ' (typically ≧100) and low magnetic losses μ" (typically ≦10). This allows the inductance of the component to be controlled (typically over a 0% to 100% range—by being closer to the membrane, inductance goes from a nominal value of X to potentially 2X) depending on the position of the membrane relative to the turns.

Figure 3:
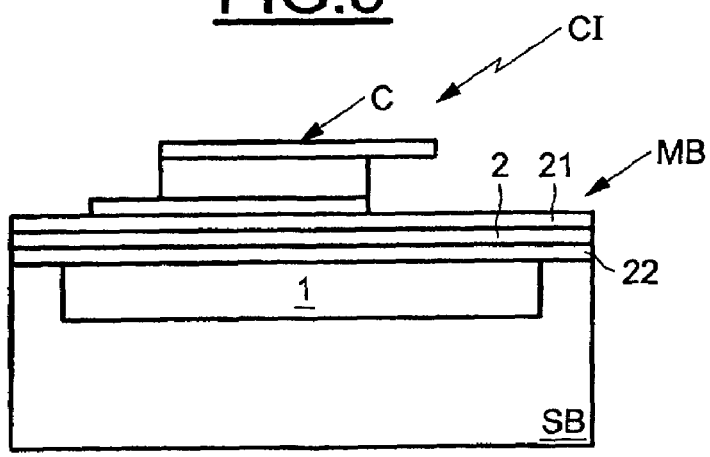

Whatever the nature of the component C, the membrane MB comprising the film 2 may form a cover for encapsulating the component C. The component C may for example be a MEMS (MicroElectroMechanical System) (see FIG. 4). The membrane MB may also, as shown schematically in FIG. 3, form a support for the component C, which may for example be a resonator of the BAW (Bulk Acoustic Wave) type.

The integrated circuits according to the present invention may comprise several, identical or different, components using two different parts of the membrane, as illustrated in FIG. 5.

This is because the membrane is formed as a "wafer-scale" membrane, that is to say it covers the entire surface of the integrated circuit. In this figure, the circuit comprises a first inductive component $C_L$, using part of the membrane, and a second component, in this example, a capacitive component $C_C$ for which another part of the membrane MB forms the dielectric of the component placed between two metal layers ML.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for obtaining a thin, insulating, soft magnetic film of high magnetization, comprising nitriding of Fe-rich ferromagnetic nanograins immersed in an amorphous substrate, and selectively oxidizing only the amorphous substrate.

2. The process according to claim 1, wherein the ferromagnetic nanograins are formed mainly from FeXN, and are not oxidized, with X being selected from the group of elements consisting of: Zr, Nb, Mo, Ru, Rh, Pd, Hf, Ta, W, Ir, Pt, Al, Si, Ti, V, Cr, Mn, Cu and the lanthanides.

3. The process according to claim 1, wherein nitriding is carried out by cathode or ion reactive sputtering.

4. The process according to claim 3, wherein nitriding is carried out in a magnetic field.

5. The process according to claim 1, wherein oxidizing is carried out by cathode or ion reactive sputtering.

6. The process according to claim 1, wherein oxidizing is carried out by selective diffusion of oxygen by heat treatment.

7. The process according to claim 6, wherein oxidizing comprises forming an FeXN/XO multilayer, followed by annealing.

8. The process according to claim 6, wherein oxidizing comprises forming a film containing FeXN and XO aggregates, followed by annealing.

9. The process according to claim 1, wherein the nanograins have a diameter of less than 10 nm.

10. The process according to claim 2, wherein the amorphous substrate essentially consists of oxidized X or XN.

11. A method, comprising:
in situ nitriding of nanograins which are immersed in an amorphous substrate; and
in situ selective oxidizing only the amorphous substrate, so as to form a thin film.

12. The method of claim 11 wherein the nanograins comprise non-oxidized Fe-rich ferromagnetic nanograins forming a crystalline phase dispersed in an amorphous phase associated with the amorphous substrate.

13. The method of claim 11 wherein a microstructure comprising a body-centered cubic crystalline phase of nitride nanograins is formed.

14. The method of claim 11 wherein a microstructure comprising a body-centered tetragonal crystalline phase of nitride nanograins is formed.

15. The method of claim 11 wherein the thin film possesses soft magnetic properties defined by Hc<10 Oe.

16. The method of claim 11 wherein the thin film has a nitrided crystalline phase dispersed in an oxidized amorphous phase.

17. The method of claim 11 wherein the thin film elementally comprises Fe, N and O as well as an additional element X selected from the group consisting of: Al, Si, Ti, V, Cr, Mn, Cu and the lanthanides.

18. The method of claim 11 wherein the thin film elementally comprises Fe, N and O as well as an additional element X selected from the group consisting of: Zr, Nb, Mo, Ru, Rh, Pd, Hf, Ta, W, Ir, and Pt.

19. The method of claim 11 further comprising forming a membrane for an integrated circuit from the thin film.

20. The method of claim 19 wherein the membrane is fixed within the integrated circuit.

21. The method of claim 19 wherein the membrane is moveable within the integrated circuit.

22. The method of claim 19 wherein the membrane is formed as a wafer scale membrane covering an entire surface of the integrated circuit.

23. A process, comprising:
cathode sputtering a plurality of a FeX layers in a stream of nitrogen and oxygen, the layers being grown in a uniaxial magnetic field;
selecting degrees of enrichment for the nitrogen and oxygen so that the sputtering produces a thin film composed of a nitrided nanostructure comprising FeXN nanograins randomly distributed in an oxidized X-rich amorphous matrix;
wherein X is selected from the group consisting of Zr, Nb, Mo, Ru, Rh, Pd, Hf, Ta, W, Ir, Pt, Al, Si, Ti, V, Cr, Mn, Cu and the lanthanides.

24. The process of claim 23 wherein selecting comprises selecting a degree of enrichment which provides a nitrogen content of between 5 at % and 20 at %.

25. The process of claim 23 wherein the FeXN nanograins have a mean diameter of between 10-2 nm with a mean intergranular distance of 5-1 nm.

26. The process of claim 23 wherein the nitrided nanostructure is not oxidized as a result of the sputtering and presence of the oxygen stream.

27. A process, comprising:
cathode sputtering a plurality of alternating FeXN and XO layers;
selecting a degree of enrichment for nitrogen in sputtering so as to produce FeXN layers each comprising a thin film composed of a nitrided nanostructure comprising FeXN nanograins randomly distributed in an X-rich amorphous matrix;

annealing the FeXN and XO layers to selectively diffuse oxygen from the XO layers into the X-rich amorphous matrix of the FeXN layers;

wherein X is selected from the group consisting of Zr, Nb, Mo, Ru, Rh, Pd, Hf, Ta, W, Ir, Pt, Al, Si, Ti, V, Cr, Mn, Cu and the lanthanides.

28. The process of claim 27 wherein annealing is performed in the presence of a magnetic field.

29. The process of claim 27 wherein the nitrided nanostructure is not oxidized as a result of the diffusion of oxygen during annealing.

30. The process of claim 27 wherein selecting a degree of enrichment comprises selecting so as to provide a nitrogen content of between 5 at % and 20 at %.

* * * * *

UNITED STATES PATENT AND TRADEMARK OFFICE
CERTIFICATE OF CORRECTION

| | | |
|---|---|---|
| PATENT NO. | : 7,504,007 B2 | Page 1 of 1 |
| APPLICATION NO. | : 11/189028 | |
| DATED | : March 17, 2009 | |
| INVENTOR(S) | : Guillaume Bouche et al. | |

It is certified that error appears in the above-identified patent and that said Letters Patent is hereby corrected as shown below:

In the Specification:

At column 4, line number 21, please delete the words "multi layers" and replace with the word -- multilayers --.

At column 8, line number 24, please delete the word "an" and replace with the word -- and --.

Signed and Sealed this
Twenty-first Day of June, 2011

David J. Kappos
*Director of the United States Patent and Trademark Office*